United States Patent [19]
Yoon et al.

[11] Patent Number: 5,869,855
[45] Date of Patent: Feb. 9, 1999

[54] CHARGE-COUPLED DEVICE WITH PHOTO CHROMIC LAYER

[75] Inventors: Jee Sung Yoon, Kyungki-do; Hyeong Ik Yun, Seoul, both of Rep. of Korea

[73] Assignee: LG Semicon Co., Ltd., Chungcheongbuk-Do, Rep. of Korea

[21] Appl. No.: 815,920

[22] Filed: Mar. 13, 1997

[30] Foreign Application Priority Data

Jun. 29, 1996 [KR] Rep. of Korea ................ 26096-1996

[51] Int. Cl.$^6$ ...................... H01L 27/148; H01L 29/768
[52] U.S. Cl. ..................... 257/229; 257/231; 257/232; 257/294; 257/432; 257/434; 257/680
[58] Field of Search .................... 257/432, 433, 257/434, 680, 232, 233, 225, 294, 229

[56] References Cited

U.S. PATENT DOCUMENTS

| | | | |
|---|---|---|---|
| 5,302,818 | 4/1994 | Pezant | 250/216 |
| 5,581,300 | 12/1996 | Kim | 348/297 |
| 5,614,990 | 3/1997 | Bruce et al. | 355/71 |

FOREIGN PATENT DOCUMENTS

| | | |
|---|---|---|
| 360053940 A | 3/1985 | Japan . |
| 407336568A | 12/1995 | Japan . |

*Primary Examiner*—William Mintel
*Attorney, Agent, or Firm*—Morgan, Lewis & Bockius LLP

[57] ABSTRACT

A charge-coupled device including, a light-receiving part having a glass and receiving an image, a photo chromic layer formed on the glass and being progressively colored according to a level of brightness of the image, to control an amount of transmitted light such that the amount of light transmitted for bright parts and dark parts of an image are substantially equalized, and a frame located on sides of the light receiving part.

4 Claims, 4 Drawing Sheets

CHARGE-COUPLED DEVICE WITH PHOTO CHROMIC LAYER

This application claims the benefit of Korean patent application No. 1996/26096, filed Jun. 29, 1996, which is hereby incorporated by reference.

BACKGROUND OF THE INVENTION

1. Field of the Invention

The present invention relates to a charge-coupled device (CCD), and more particularly, to a charge-coupled device which improves the resolution of a device.

2. Discussion of the Related Art

In general, a CCD can be divided into a light-receiving part for receiving light, a transfer channel part for transferring charges, and a charge detector of observing the amount of signal charge and converting it into a voltage.

Recently, as systems utilizing the CCD attempt to achieve a light weight and a high resolution, the number of pixels has increased and the size of a CCD chip has decreased. Thus, the area occupied by the light-receiving part that can receive light has decreased, reducing the signal amount and deteriorating characteristics such as a dynamic range. In order to improve the resolution and to maintain the high sensitivity, the reduction of noise level is necessary. However, since the relation between the sensitivity and resolution is a trade-off, simultaneously improving both is difficult.

When imaging is carried out, the degradation of definition due to the difference of the partial brightness of the image is caused by the limited dynamic range, so that this aspect becomes an important cause of deteriorating device characteristics.

Recently, the Matushita Co. of Japan has suggested a method with the construction of one screen such that a long exposure signal (LE signal) and a short exposure signal (SE signal) appear alternately, thereby enlarging the dynamic range of the CCD.

However, with this method, a method of transferring the image charge should be changed. Further, the problem of deteriorating sensitivity of the device cannot be solved.

A conventional device will how be described with reference to the attached drawings.

FIG. 1 shows the construction of a conventional charge-coupled device. In general, the charge-coupled device comprises a plurality of photodiodes 1 arranged in a matrix for converting an optical image signal into an electrical signal, vertical charge transfer regions 2 transferring the image charge from the photodiode 1 region in a vertical direction, a horizontal charge transfer region 3 for transferring the image charge transferred in the vertical direction through vertical charge transfer region 2 in a horizontal direction, and a sensing amplifier 4 for sensing the image charge transferred in the horizontal direction and outputting a signal to a peripheral circuit.

In the CCD as constructed above, the image charges converted and generated in the photodiodes 1 are moved to vertical charge transfer region 2 by a pulse that is periodically applied to a transfer gate (not shown).

Then, the image charges moved to vertical charge transfer region 2 and horizontal charge transfer region 3 are transferred to an output terminal of the CCD, according to the variation of the potential well caused by a clock signal applied repeatedly.

When a CCD camera is constructed using the above CCD, by detecting an average illumination of an image imaged by the CCD through a lens, an iris should be adjusted so that the average illumination of the above image is fit for the dynamic range of the CCD.

If the signal level is a specific value or less, gain should be properly adjusted through an automatic gain controller.

However, in the conventional CCD, the following problems exist.

In general, the dynamic range of the CCD is not more than $\frac{1}{10}$ of a brightness that exists. in nature. Accordingly, imaging one object with the above brightness on one screen by using the charge-coupled device is impossible, because even if the iris is adjusted, imaging is possible only if the imaging screen is clear or dark on the whole. Further, imaging the object in which the clear part and dark part exist partially together is impossible because the degradation of definition occurs in the dark part.

SUMMARY OF THE INVENTION

Accordingly, the present invention is directed to a charged-coupled device that substantially obviates one or more of the problems due to the limitations and disadvantages of the related art.

An object of the present invention is to provide a charge-coupled device including a light-receiving part having a glass and receiving an image, and a photo chromic layer formed on the glass and being progressively colored according to a level of brightness of the image, to control an amount of the transmitted light such that the amount of light transmitted for bright parts and dark parts of an image are substantially equalized, and a frame located on sides of the light receiving part.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and in accordance with the purpose of the present invention, as embodied and broadly described, in accordance with a first aspect of the present invention there is provided a charge-coupled device including, a light-receiving part having a glass and receiving an image, a photo chromic layer formed on the glass and being progressively colored according to a level of brightness of the image, to control an amount of transmitted light such that the amount of light transmitted for bright parts and dark parts of an image are substantially equalized, and a frame located on sides of the light receiving part.

It is to be understood that both the foregoing general description and the following. detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
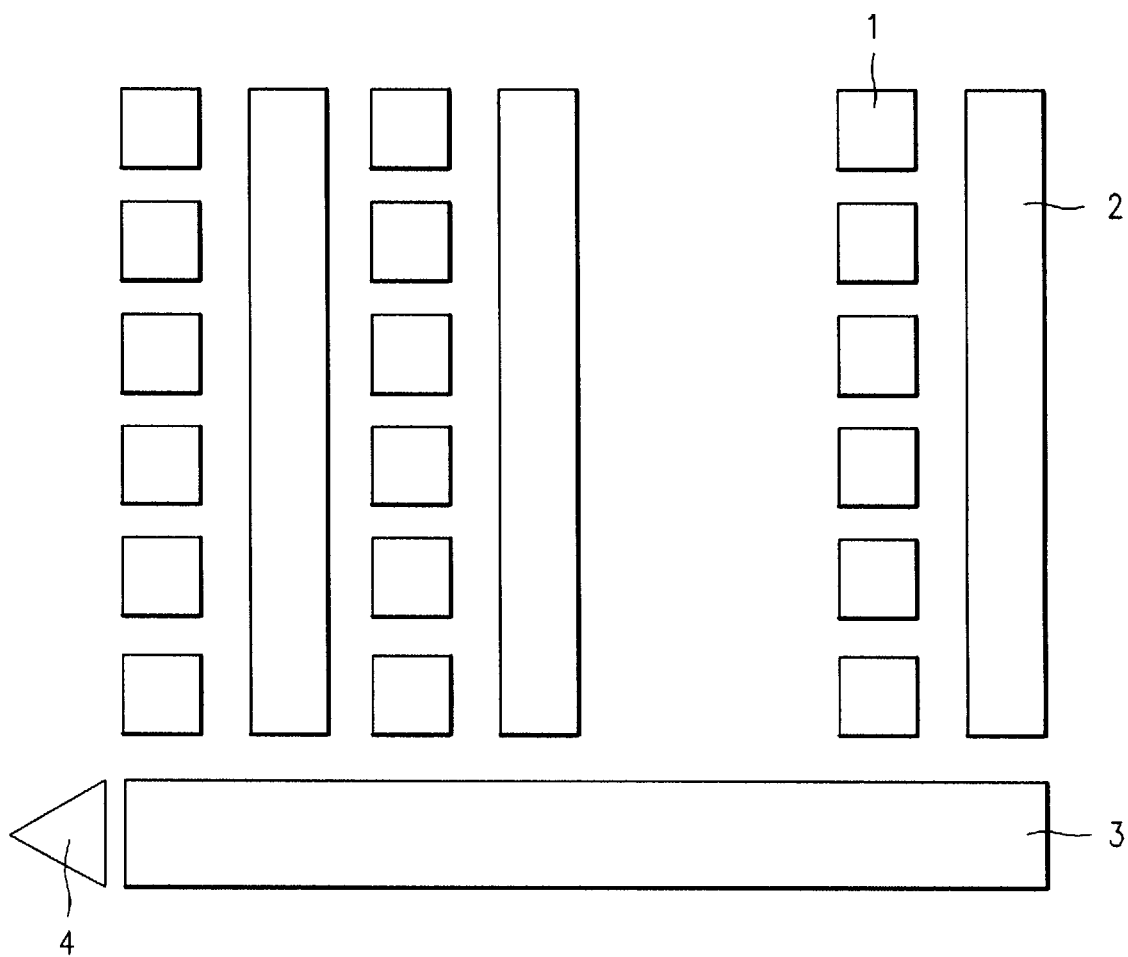
FIG. 1 shows the construction of a conventional charge-coupled device.
Figure 2B:
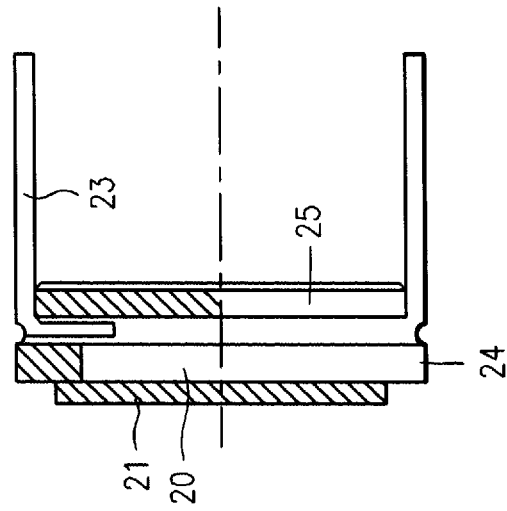
FIG. 2 shows a package for of a charge-coupled device.
Figure 2A:
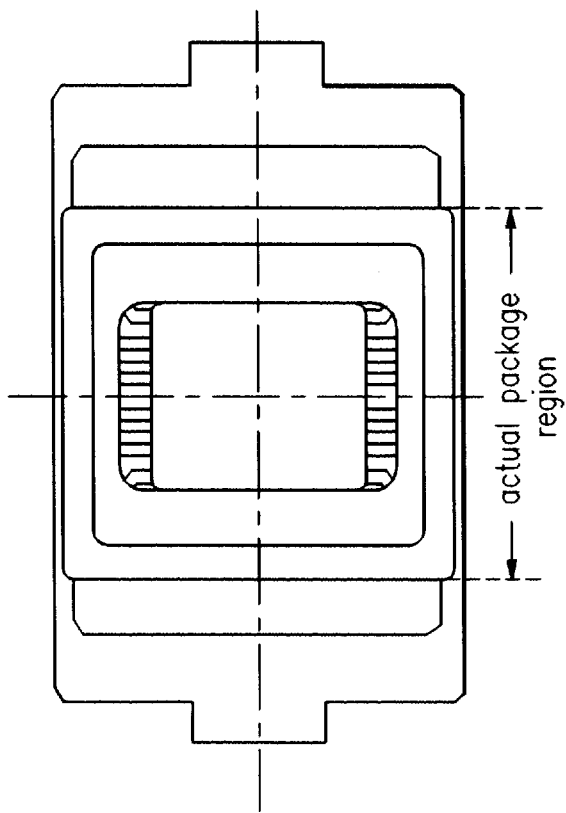
Figure 2D:
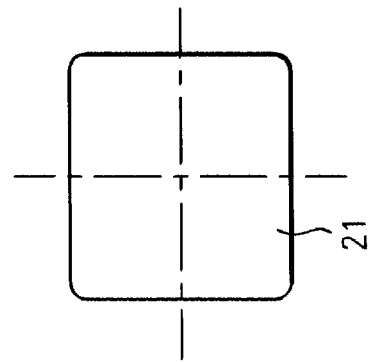
Figure 2C:
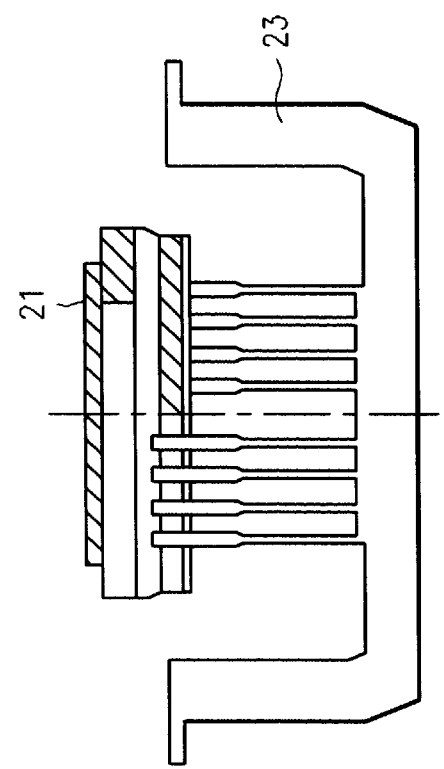
Figure 3:
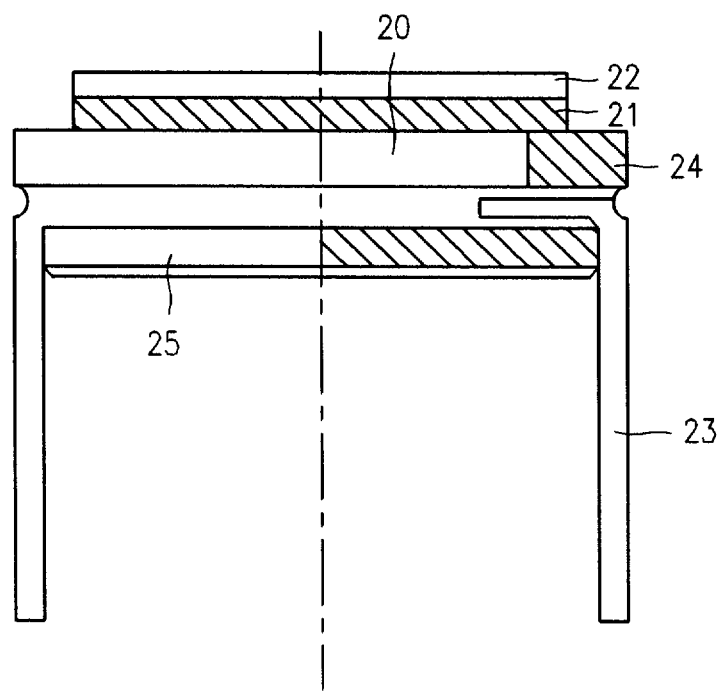
FIG. 3 shows the construction of a charge-coupled device of the present invention.

FIG. 2 shows the package for a charge-coupled device, and FIG. 3 shows the construction of a charge-coupled device of the present invention.

In the charge-coupled device of the present invention, above a light-receiving glass 21 is formed on the package of a CCD 20 including a plurality of photodiodes arranged in a matrix and converting an optical image signal into an electrical signal. A vertical charge transfer region transfers the image charge converted and generated in the photodiode region in a vertical direction, and a horizontal charge transfer region transferring the image charge transferred in the vertical direction through the vertical charge transfer region in a horizontal direction. A photo chromic layer 22 is formed in which coloration and decoloration phenomena occur by the intensity of light to thereby vary the transmissivity of light.

The photo chromic layer 22 is provided on the surface of the glass 21 (see FIG. 3) which includes either a material formed by adding a fine halogenate silver crystal into an inorganic glass or a material formed by adding silver chloride (AgCl) and copper chloride (CuCl) crystals into an inorganic glass.

That is, to form the photo chromic layer 22, either the halogenate silver crystal or AgCl and CuCl crystals are added to glass while it is in the molten state. The glass consists of a complex matrix of silicates which is ordinarily transparent to visible light.

The CCD package process for forming the charge-coupled device of the present invention will now be described. The CCD is packaged so that the charge-coupled device is diced so that an end user can use it easily. Generally, integrated circuit (IC) packages are either a plastic type and a ceramic type. In addition, they can be further classified by their shape.

The package that is presently used for the CCD is a side brazed shape of the ceramic type and constructed by sealing a glass lid.

The package process of the CCD is progressed in the sequence of inspecting whether the package of a fab-out wafer is applicable or not, inspecting whether the attachment of the wafer and the detachment of a chip are suitable or not (inspection to the UV tape import, mounting the wafer, dicing/sawing the chip, die-attaching the diced chip on a ceramic substrate, irradiating UV-rays and curing an epoxy, wirebonding, sealing, trimming a lead, marking the back side, and curing.

In the charge-coupled device of the present invention, in the sealing process of the CCD package processes progressed as described above, the photo chromic layer 22 is formed on the glass surface of the light-receiving part.

FIG. 3 shows the construction of the CCD package. The CCD package includes a CCD 20 located on a ceramic base 25, a ceramic frame 24 formed on a part excluding the active region of CCD 20, a lead frame 23 connected to the CCD 20 between the ceramic frame 24 and the ceramic base 25, and a light-receiving glass 21 sealed on the ceramic frame 24.

In the charge-coupled device of the present invention, the photo chromic layer 22 is selectively colored or decolored in response to a brightness of an optical image, controlling the amount of the transmitted light on the light-receiving glass 21.

For example, the photo chromic layer 22 is easily colored or decolored by oxidation-reduction reactions of AgCl in response to light. That is, AgCl is susceptible to oxidation and reduction by light as described below.

$Cl^- \rightarrow Cl + e^-$ (oxidation)

$Ag^+ + e^- \rightarrow Ag$ (reduction)

As described in the reactions above, the chloride ions are oxidized to produce chloride atoms and electrons. The electrons are then transferred to silver ions to produce silver atoms. The ions cluster together and block the transmittance of light, causing the light-receiving glass 21 to be colored. Such a photo chromic process occurs almost simultaneously with the incidence of light, and the photo chromic process is dependent on the intensity of the light.

That is, the following reactions occur:

$Cl + Cu^+ \rightarrow Cu^{+2} + Cl^-$

The chlorine ions formed by the exposure to light are reduced by the electrons of the copper ions, preventing their escape as gaseous atoms from the matrix of the glass.

The copper $Cu^{+1}$ ions are oxidized to produce copper $Cu^{+2}$ ions, and then react with the silver atoms as shown:

$Cu^{+2} + Ag \rightarrow Cu^{+1} + Ag^+$

Such reactions of AgCl and CuCl crystals repeat, thereby causing the light-receiving glass 21 to become colored or decolored in response to the intensity of the light.

According to the brightness of the image received through a lens, the photo chromic layer 22 formed on the light-receiving glass 21 is colored or decolored, and the dynamic range of light that passes through light-receiving glass 21 is controlled so as to be suitable for the charge-coupled device.

That is, since the bright part of the image signal is one that passes through the colored region of the photo chromic layer 22 and becomes somewhat dark so as to be suitable for the dynamic range of the charge-coupled device.

Further, since the dark part of the image signal is one that passes through the uncolored region of the photo chromic layer 22, it becomes imaged with the original brightness.

Accordingly, imaging the dark and clear parts of the image is carried out without the degradation of the image. When imaging of the bright parts of the image is carried out, the photo chromic layer 22 is colored in its entirety to control the brightness, increasing the dynamic range of the CCD.

When the charge-coupled device of the present invention is used in a CCD camera system, the amount of the transmitted light is not controlled by the iris, but controlled by the photo chromic layer 22 that is colored or decolored by the brightness. Thus, the system can be simplified. Further, the dynamic range of the charge-coupled device is enlarged efficiently, thereby raising the resolution of the image-pickup device.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A charge-coupled device comprising:

a light-receiving part having a glass and receiving an image;

a photo chromic layer formed on the glass and being progressively colored according to a level of brightness of the image, to control an amount of transmitted light such that the amount of light transmitted for bright parts and dark parts of an image are substantially equalized; and a frame located on sides of the light receiving part.

2. The charge-coupled device as claimed in claim 1, wherein the photo chromic layer is formed by adding fine halogenate silver crystals into an inorganic glass.

3. The charge-coupled device as claimed in claim 1, wherein the photo chromic layer is formed by adding fine silver chloride and copper chloride crystals into an inorganic glass.

4. The charge-coupled device as claimed in claim 1, wherein the glass includes a complex matrix of silicates, the matrix being transparent to visible light.

* * * * *